(12) United States Patent
Gonzalez et al.

(10) Patent No.: US 6,211,545 B1
(45) Date of Patent: *Apr. 3, 2001

(54) DEVICE FABRICATED BY A METHOD OF CONTROLLING OUTDIFFUSION FROM A DOPED THREE-DIMENSIONAL FILM

(75) Inventors: Fernando Gonzalez; D. Mark Durcan, both of Boise; Luan C. Tran, Meridian; Robert B. Kerr, Boise; David F. Cheffings, Boise; Howard E. Rhodes, Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,515

(22) Filed: May 12, 1999

Related U.S. Application Data

(62) Division of application No. 08/587,277, filed on Jan. 18, 1996.

(51) Int. Cl.⁷ .......................... H01L 27/108; H01L 29/76; H01L 29/94; H01L 31/119
(52) U.S. Cl. .......................... 257/306; 257/296; 257/300; 438/253
(58) Field of Search .................................... 257/303, 300, 257/309, 306, 296; 438/250, 253

(56) References Cited

U.S. PATENT DOCUMENTS

| | | |
|---|---|---|
| 4,280,854 | 7/1981 | Shibata et al. . |
| 4,629,520 | 12/1986 | Ueno et al. . |
| 5,037,773 | 8/1991 | Lee et al. . |
| 5,130,885 * | 7/1992 | Fazan et al. .......................... 361/313 |
| 5,155,369 | 10/1992 | Current . |
| 5,176,789 | 1/1993 | Yamazaki et al. . |
| 5,177,030 | 1/1993 | Lee et al. . |
| 5,198,386 | 3/1993 | Gonzalez . |
| 5,346,836 | 9/1994 | Manning et al. . |
| 5,348,901 | 9/1994 | Chen et al. . |
| 5,393,687 | 2/1995 | Liang . |
| 5,413,950 | 5/1995 | Chen et al. . |
| 5,578,516 * | 11/1996 | Chou ....................................... 437/52 |
| 5,597,754 | 1/1997 | Lou et al. . |
| 5,599,736 | 2/1997 | Tseng . |
| 5,618,747 * | 4/1997 | Lou ....................................... 438/398 |
| 5,712,181 | 1/1998 | Byun et al. . |
| 5,763,306 * | 6/1998 | Tsai ....................................... 438/255 |
| 5,804,852 * | 9/1998 | Yang et al. .......................... 257/308 |

* cited by examiner

*Primary Examiner*—Steven H. Loke
*Assistant Examiner*—Douglas W. Owens
(74) *Attorney, Agent, or Firm*—Thorp Reed & Armstrong

(57) ABSTRACT

A solid state fabrication technique for controlling the amount of outdiffusion from a three-dimensional film is comprised of the step of providing a first layer of insitu doped film in a manner to define an upper portion and a lower portion. A second layer of undoped film is provided on top of the first layer to similarly define an upper portion and a lower portion. The first and second layers are etched according to a predetermined pattern. The second layer is doped to obtain a desired dopant density which decreases from the upper portion to the lower portion. Outdiffusion of the dopant from the upper portion of the second layer results in the dopant migrating to the lower portion of the second layer. Thus, outdiffusion into the substrate, and the problems caused thereby, are eliminated or greatly reduced.

16 Claims, 4 Drawing Sheets

DEVICE FABRICATED BY A METHOD OF CONTROLLING OUTDIFFUSION FROM A DOPED THREE-DIMENSIONAL FILM

This application is a divisional of U.S. application Ser. No. 08/587,277 filed Jan. 18, 1996.

BACKGROUND OF THE INVENTION

1. Field of the Invention

The present invention is directed to solid state fabrication techniques and, more particularly, to techniques used to produce three-dimensional, doped films particularly useful in the construction of solid state memory devices.

2. Description of the Background

Memory cells, such as those of dynamic random access memories (DRAM), are comprised of two main components: a field-effect transistor (FET) and a capacitor. In memory cells utilizing a conventional planar capacitor, far more chip surface area is dedicated to the planar capacitor than to the FET. Wordlines are generally etched from a polysilicon-1 layer. A doped region of silicon substrate functions as the lower (storage-node) capacitor plate while a doped polysilicon-2 layer generally functions as the upper capacitor plate (cell plate). Although planar capacitors have generally proven adequate for use in memory chips up to the one-megabyte level, they are considered to be unusable for more advanced memory generations.

As component density in memory chips has increased, the shrinkage of cell capacitor size has resulted in a number of problems. Firstly, the alpha-particle component of normal background radiation can generate hole-electron pairs in the silicon substrate, which can be collected by the lower capacitor plate. The phenomena will cause a charge stored within the affected cell capacitor to rapidly dissipate, resulting in a "soft" error. Secondly, the sense amplifier differential signal is reduced. That aggravates noise sensitivity and makes it more difficult to design column sense-amplifiers having appropriate signal selectivity. Thirdly, as cell capacitor size is decreased, the smaller charge stored within the cell leaks to an unusable level sooner, which necessitates more frequent interruptions for refresh overhead.

As a result of the problems associated with the use of planar capacitors for high-density memories, manufacturers of, for example, 4-megabyte DRAMs are utilizing cell designs based on non-planar capacitors. Two basic non-planar capacitor designs are currently in use: the trench capacitor and the stacked capacitor. Both types of non-planar capacitors typically require a considerably greater number of masking, deposition, and etching steps for their manufacture than does a planar capacitor.

In a trench capacitor, charge is stored primarily vertically, as opposed to horizontally in a planar capacitor. Because trench capacitors are fabricated in trenches which are etched in the substrate, some trench capacitor structures can be susceptible to soft errors. In addition, there are several other problems inherent in the trench design. One problem is that of trench-to-trench charge leakage caused by the parasitic transistor effect between adjacent trenches. Another problem is cell storage node-to-substrate leakage attributable to single crystal defects which are induced by stress associated with the trench structure. Yet another problem is the difficulty of completely cleaning the trenches during the fabrication process. Failure to completely clean a trench will generally result in a defective cell.

The stacked capacitor design, on the other hand, has proven somewhat more reliable and easier to fabricate than the trench design. However, in the stacked capacitor design, the layer of material which forms the storage node is in contact with the substrate. Subsequent processing steps tend to cause outdiffusion of the dopant which adversely affects the diode junction profile as well as the threshold voltage for the access transistor. Thus, the need exists for a method of controlling the outdiffusion from a doped three-dimensional film.

SUMMARY OF THE INVENTION

The present invention, in its broadest aspect, is directed to a solid state fabrication technique for controlling the amount of outdiffusion from a three-dimensional film. The technique is comprised of the steps of providing a first layer of insitu doped film in a manner to define an upper and a lower portion. A second layer of undoped film is then provided in a manner to similarly define an upper and a lower portion. The first and second layers are etched according to a predetermined pattern. The second layer is doped with an implant to obtain a desired dopant density which decreases from the upper to the lower portion of the second layer. By decreasing the density of the desired dopant at the lower portion of the film, outdiffusion of the dopant into the substrate is greatly reduced. Outdiffusion of the dopant from the upper portion of the second layer results in the dopant migrating to the lower portion of the second layer. Thus, outdiffusion into the substrate, and the problems caused thereby, are eliminated or greatly reduced.

In one application of the present invention, the fabrication technique may be used for controlling the amount of outdiffusion from a stacked, polysilicon storage node. According to that embodiment of the present invention, a first layer of insitu doped polysilicon is provided in a manner to define an upper portion and a lower portion of the first layer. A second layer of undoped polysilicon is provided in a manner to define an upper and a lower portion of the second layer. The first and second layers of polysilicon are etched according to a storage node pattern. The second layer of polysilicon is doped with an angled implant to obtain a desired dopant density which decreases from the upper portion to the lower portion of the second layer. The doping step may be carried out using two different angles of orientation for the implant. The angle of incidence of the implant with the wafer's surface varies from between approximately seven to twenty-five degrees. The lower dopant dosages coupled with improved performance of the capacitor offset the extra fabrication time required by the two-angle implant.

The method of the present invention can be adapted to provide a fabrication technique for constructing a stacked capacitor. The present invention is accordingly directed to a fabrication technique for constructing a stacked capacitor and such a stacked capacitor. The fabrication technique for constructing the stacked capacitor is comprised of the steps of providing a first layer of insitu, lightly doped film. A second layer of undoped film is provided on top of the first layer. The first and second layers are etched according to a storage node pattern. The second layer is doped to achieve a higher level of dopant in the second layer than the level of dopant in the first layer. A level of dielectric material is provided and then etched so as to leave portions of the dielectric layer on top of the second layer. A layer of cell plate material is provided and then etched to form the capacitor's cell plate. By utilizing a two film approach for creating the capacitor's storage node, outdiffusion from the storage node into the substrate is greatly reduced or eliminated. Controlling or eliminating the outdiffusion results in improved characteristics of the diode junction profile, longer periods before static refresh is required, and better results with respect to soft errors. Those, and other advantages and benefits of the present invention, will become apparent from the Description Of The Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

For the present invention to be understood, the present invention will be described in the context of fabricating stacked capacitors for a DRAM cell. The reader should recognize that the present invention is not limited to the fabrication of any particular device. Rather, the techniques of the present invention may be employed in the fabrication of a variety of devices. The following description in conjunction with the fabrication of stacked capacitors for a DRAM cell is for purposes of illustration only and not limitation.

Figure 1:
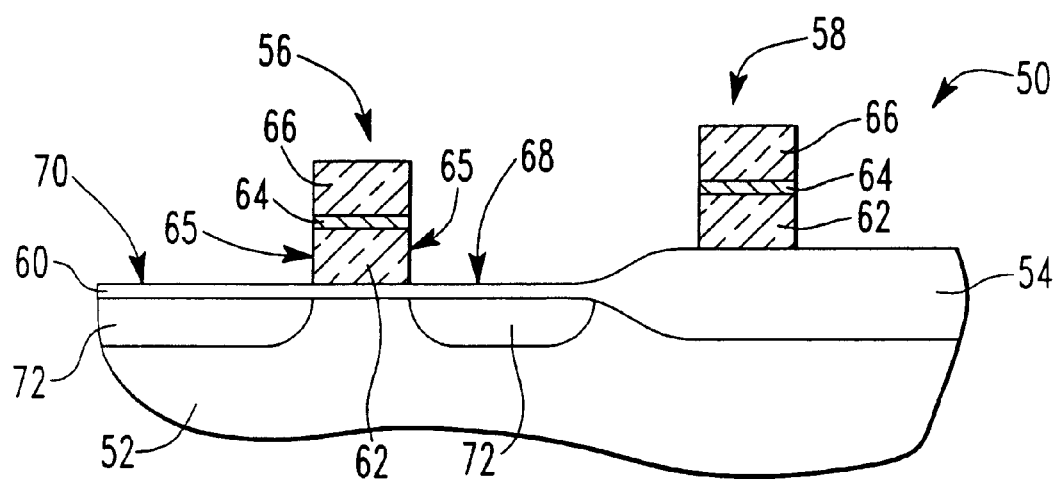
FIGS. 1 through 3 illustrate a series of fabrication steps which show one example of providing an array of electrically insulated word lines on top of a semiconductor wafer while defining upwardly exposed active regions adjacent the word lines for connection with memory cell capacitors.

Turning first to FIG. 1, a semiconductor wafer fragment 50 comprised of a bulk substrate region 52, field oxidation region 54, and a pair of wordlines 56, 58 is illustrated. Wordlines 56 and 58 are comprised of a gate oxide region 60, conductively doped polysilicon region 62, a metal silicide layer 64, and a overlying oxide cap 66. Layers 66, 64, and 62 have been patterned as shown to define wordline outlines 56, 58. Wordlines 56, 58 include opposing edges 65 of polysilicon material. Wordlines 56, 58 are patterned to define a first region 68 for formation of first n-channel active areas for electrical connection with a memory cell capacitor, and to define a second region 70 for formation of second n-channel active areas for electrical connection with bit lines.

A punch-through, p-type, lightly doped halo implant is conducted through gate oxide layer 60 into first and second regions 68, 70, respectively, to define implant region 72 for use in formation of lightly doped source/drain (LDD) regions for the first and second n-channel active areas. An example dopant would be boron implanted at an energy of 50 KeV at a dose of $4 \times 10^{12}$ atoms/cm$^2$.

Figure 2:
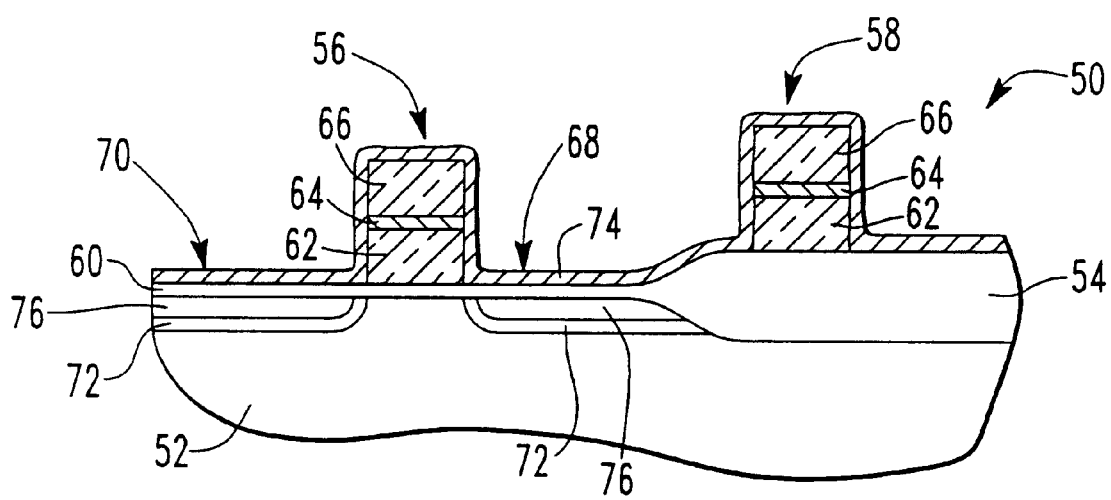

Referring to FIG. 2, wafer 50 is subjected to oxidizing conditions to grow an oxide layer 74 on the upper surface of the wafer 50. After the oxide layer 74 is grown, an n-LDD implant is conducted into first and second regions 68, 70, respectively, to define n-type implant regions 76. An example deposition would be to provide a phosphorus dopant at 100 KeV at a dose of $1.5 \times 10^{13}$ atoms/cm$^2$.

Figure 3:
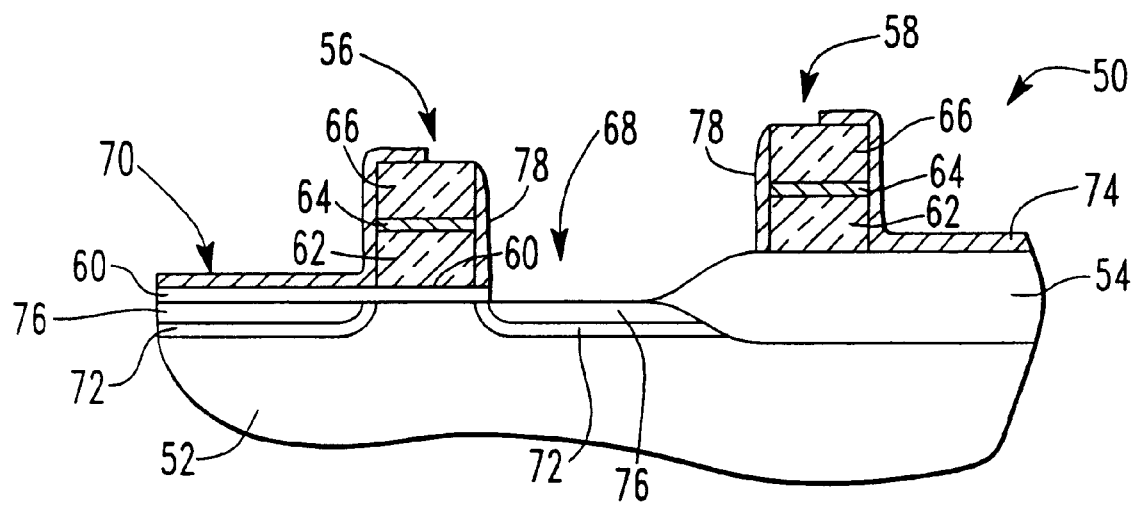

Referring to FIG. 3, the oxide layer 74 is etched to define wordline spacers 78. The typical and preferred etch for producing spacers 78 is a dry reactive ion etch. During such etch or thereafter, any remaining insulating material of exposed layer 60 is etched to upwardly expose first region 68.

The above described process through FIG. 3 is but one example of how to provide an array of electrically insulated wordlines on top of a semiconductor wafer and define upwardly exposed first active regions adjacent the wordlines for connection with memory cell capacitors. Other methods could be utilized.

Figure 4:
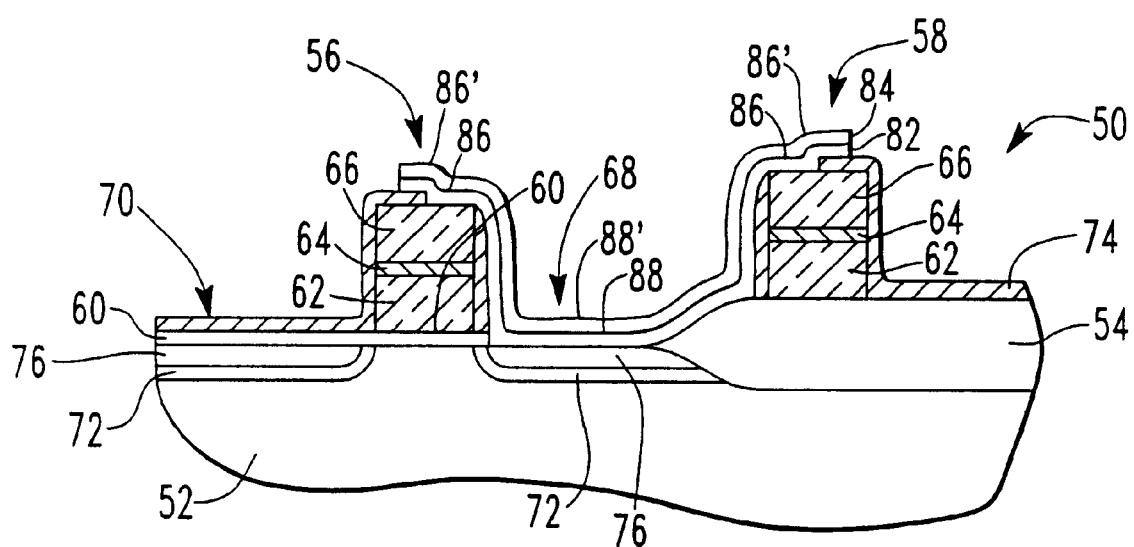
FIG. 4 illustrates the wafer of FIG. 3 with a first layer of polysilicon and a second layer of polysilicon deposited thereon and etched according to a storage node pattern.

Referring to FIG. 4, the wafer may be exposed to a polysilicon-2 piranha cleaning step as well as a polysilicon-2 HF cleaning step. The purpose of the two cleaning steps is to remove any remaining photoresist, any organics, as well as to remove native oxides from the surface of the wafer. Thereafter, an insitu doped layer of polysilicon 82 is deposited on top of the wafer to contact and cover operatively exposed first active region 68. Polysilicon layer 82 is preferably an insitu, lightly doped layer. Layer 82 is of a relatively high resistivity on the order of 100–1000 Ω/square. The thickness of the layer 82 is approximately 600–1200 Angstroms. The layer 82 is deposited in a manner that defines upper portions 86 positioned on top of word lines 56, 58 and a lower portion 88 positioned on top of region 76.

Thereafter, the wafer may be subjected to another HF cleaning step. After the cleaning step, an HSG polysilicon-2 layer 84 is deposited on top of the first layer 82. The second layer 84 may be a rugged layer of polysilicon as disclosed in U.S. Pat. No. 5,037,773 entitled Stacked Capacitor Doping Technique Making Use Of Rugged Polysilicon, which is hereby incorporated by reference. The second layer 84 is an undoped layer approximately 600 Angstroms thick. The second layer is deposited in a manner that defines an upper portion 86' on top of upper portion 86 and a lower portion 88' on top of lower portion 88. Thereafter, the layers 82 and 84 are etched according to a predetermined pattern, in the present case a storage node polysilicon pattern, which results in the structure illustrated in FIG. 4. The etch may be a dry etch, and the photoresist may be removed with an ash/piranha two-step process. Thereafter, the wafer may be subjected to another piranha cleaning step.

Figure 5:
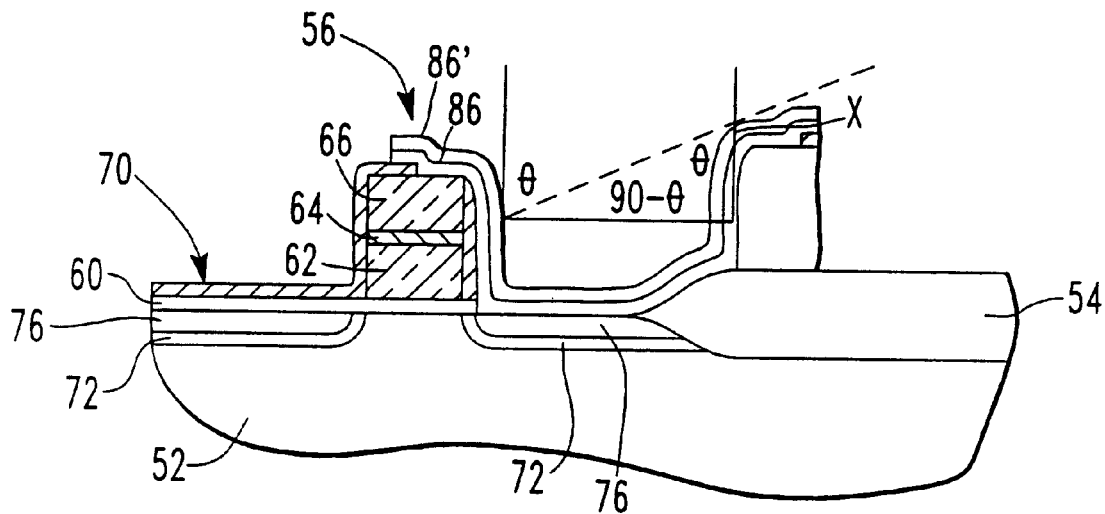
FIG. 5 illustrates the second polysilicon layer being subjected to a angled ion implant.

FIG. 5, which is not drawn to scale, illustrates the second polysilicon layer 84 being subjected to an angled ion implant. In the figure, from the top of the upper portion 86' to the top of the lower portion 88' is approximately 1.1 microns. The width of the generally U-shaped opening formed by the lower portion 88 separating upper portions 86 is approximately 0.3 microns. The angle of incidence θ can be determined by assuming a value for X in FIG. 5. If X is chosen to be 1.1 microns, such that the implant reaches the lower portion 88' of the second layer 84, then the angle of incidence is approximately 15°. Increasing the angle above 15° causes the dopant to be implanted further up the layer toward the upper portion 86'. By controlling the angle of incidence θ, a predetermined dopant density profile can be obtained in which the density of the dopant decreases from the upper portion 86' to the lower portion 88'. The angles and dimensions given herein are exemplary only such that different film geometries with different dimensions, will yield different angles of implementation.

It is likely that for the film geometry illustrated in FIG. 5, two angles of implantation, with the angle of implantation being relative to the wafer flat, of, for example, 90° and 270°, will be sufficient. For other types of geometries, such as three dimensional circular structures, four-angle implants at, for example, 0°, 90°, 180°, and 270°, may be required to fully implant the geometry.

The dopant levels necessary are anticipated to be on the order of 1 to $5 \times 10^{15}$ atoms/cm² total dose. With such dopant levels, the layer 84 is of a relatively low resistivity, on the order of 80–400 Ω/square. To prevent capacitor depletion effects, it is expected that a medium current machine such as a Varian Model E500 may not be suitable because of its lower beam currents. A high current machine which runs batch wafers could be configured to run at the desired angles of incidence of between approximately seven to twenty-five degrees. The dose requirements for the present invention are somewhat less than for a zero degree implant wherein the process relies upon scattered ions to reach the sidewall of the storage node. Thus, the dosage levels anticipated with the angled implant of the present invention are lower than the dosage levels associated with zero degree implants.

Figure 6A:
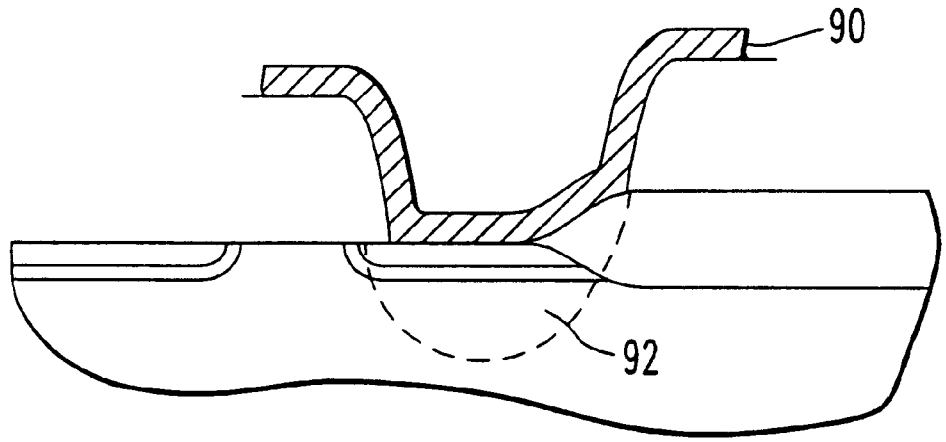
FIGS. 6a and 6b compare outdiffusion from a polysilicon layer of the prior art with the outdiffusion from the first and second polysilicon layers of the present invention, respectively.
Figure 6B:
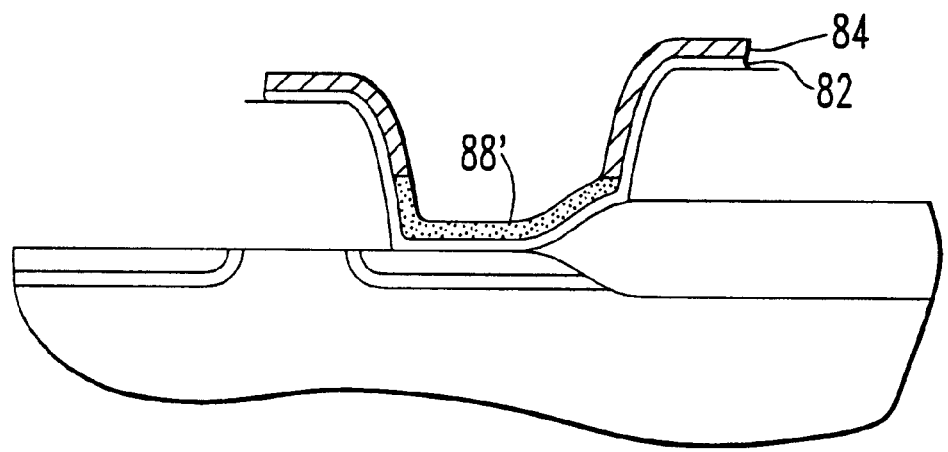

FIGS. 6a and 6b compare the outdiffusion from a polysililcon layer 90 of the prior art with the outdiffusion from the first 82 and second 84 polysilicon layers of the present invention, respectively. The prior art uses a single polysilicon layer 90 as the storage node poly, as shown in FIG. 6a, which is doped after the polysilicon has been deposited. The post deposition period requires a high temperature that drives the dopant into the layer 90 and oxidizes the top of the layer as well, which slightly thins the layer 90. The higher temperature drives the dopant not only into the layer 90 but also through the layer 90 into the silicon substrate below as identified by the numeral 92 in FIG. 6a. Because the doping step requires that the polysilicon layer 90 be heavily doped to reduce its resistivity so that there are no depletion effects at the capacitor interface, the extra dopant, due to poor control of the doping concentration, leads to excessive outdiffusion into the substrate.

In contrast, the two layer method of the present invention improves the outdiffusion characteristics by performing a slight, insitu phosphorous doping of the first layer 82. The second layer 84 is deposited at about 500° C. to 530° C. such that very little outdiffusion occurs during the deposition phase. The second layer is then implanted with a heavy dose at an angle to tailor the doping concentration from the upper portion 86' to the lower portion 88'. The subsequent heat steps will first drive the dopant into layer 84. The dopant will then be driven from the hatched region as shown in FIG. 6b to the dotted region. The net effect will be that the doping of the lower portion 88 of the polysilicon layer 82 is no greater than the doping in the initial insitu layer 82. That means that there will be a minimal amount of controlled diffusion into the storage node diode n-plate. Use of the two layers 82 and 84 in place of the single prior art layer 90, together with the angled implant thus keeps the dopant from the bottom of the storage node.

The outdiffusion found in the prior art effects the diode junction profile such that charge leakage is greater and the threshold voltage on the access transistor is lowered. The present invention, by eliminating the outdiffusion region 92 found in the prior art, results in better control over the threshold voltage of the access transistor, longer periods before static refresh is required, and better results with respect to soft errors. Those advantages, coupled with lower dosages, are believed to offset the somewhat longer processing time required by a two-angle or a four-angle implant.

Figure 7:
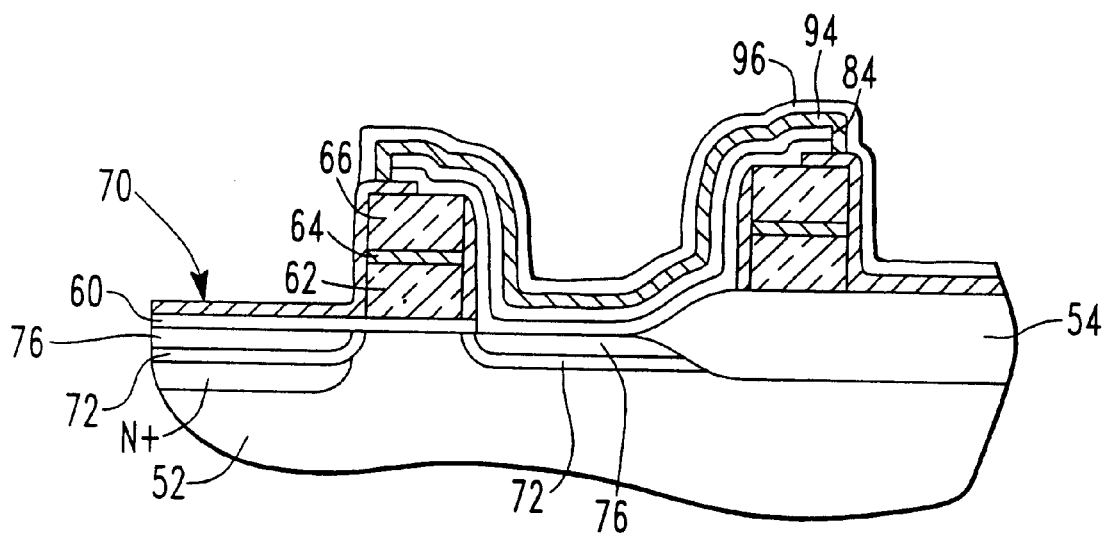
FIG. 7 illustrates the wafer of FIGS. 1–3 with the fabrication of the capacitor completed.

Returning to FIG. 4, once the second polysilicon layer 84 has been appropriately doped, the circuit may be completed using prior art fabrication techniques. For example, the circuit may be completed using the techniques found in U.S. Pat. No. 5,198,386 entitled Method Of Making Stacked Capacitors For DRAM Cell, which is hereby incorporated by reference. For example, with reference to FIG. 7, a layer 94 of capacitor dielectric material is provided on top of the second polysilicon layer 84. A subsequent layer 96 of polysilicon is provided on top of dielectric layer 94 to provide the upper plate, or cell plate, of the capacitor. After the dielectric layer 94 and layer of cell polysilicon 96 are patterned, the resulting capacitor is illustrated in FIG. 7.

While the present invention has been described in conjunction with a preferred embodiment thereof, those of ordinary skill in the art will recognize that many modifications of the present invention may be implemented. The foregoing description and the following claims are intended to cover all such modifications and variations.

What is claimed is:

1. A stacked capacitor formed on a supporting substrate, comprising:
   a lower cell plate comprised of a first layer of lightly doped film supported by the substrate in a manner to define an upper portion and a lower portion and a second layer of heavily doped film positioned on top of said first layer in a manner to define an upper portion and a lower portion, said second layer having a dopant density which decreases from said upper portion to said lower portion;
   a layer of dielectric material positioned on top of said second layer; and
   a layer of cell plate material positioned on top of said layer of dielectric material.

2. The capacitor of claim 1 wherein said first layer of film includes a first layer of polysilicon approximately 600–1200 Angstroms thick and wherein said second layer of film includes a second layer of polysilicon approximately 600 Angstroms thick.

3. The capacitor of claim 1 wherein said second layer of film includes a rugged layer of polysilicon.

4. A stacked capacitor formed on a supporting substrate having wordlines and an active region therebetween, comprising:
   a lower cell plate extending from the top of one wordline to the top of another wordline and overlying the active region therebetween, said lower cell plate comprised of a first layer of lightly doped film and a second layer of heavily doped film on top of said first layer of film, said second layer having a dopant density which decreases from said portions overlying the tops of the wordlines to the portion overlaying the active region;
   a layer of dielectric material positioned on top of said layers of film; and
   a layer of cell plate material positioned on top of said layer of dielectric material.

5. The capacitor of claim 4 wherein said two layers of film include a first layer of polysilicon approximately 600–1200 Angstroms thick and a second layer of polysilicon approximately 600 Angstroms thick.

6. The capacitor of claim 4 wherein said two layers of film include a first layer of polysilicon and a second layer of rugged polysilicon.

7. A combination, comprising:
   a substrate having a plurality of active regions formed therein;
   a plurality of gate oxide regions positioned between certain of said active regions and a plurality of field oxide regions separating certain said active regions;

a plurality of wordline structures running in parallel rows such that when a first wordline structure overlies a gate oxide region, a second adjacent wordline structure overlies a field oxide region, and an active region is positioned therebetween;

a plurality of lower cell plates each extending from the top of said first wordline structure, over one of said active regions to the top of said second wordline structure, each of said lower cell plates being comprised of a first layer of lightly doped film and a second layer of heavily doped film on top of said first layer of film, said second layer having a dopant density which decreases from said portions overlying the tops of the wordlines to the portion overlaying the active region;

a layer of dielectric material patterned such that a portion of said layer is positioned on top of one of each of said lower cell plates; and a plurality of upper cell plates each positioned on top of one of said portions of dielectric material.

8. The combination of claim 7 wherein said active regions include a halo region and an n-type implant region.

9. The combination of claim 7 wherein said plurality of wordline structures each includes, in a stack, a conductively doped polysilicon region, a metal silicide layer and an oxide cap said plurality of wordline structures each further including an oxide spacer positioned between said stack and said lower cell plate.

10. The combination of claim 7 wherein said two layers of film include a first layer of polysilicon approximately 600–1200 Angstroms thick and a second layer of polysilicon approximately 600 Angstroms thick.

11. The combination of claim 7 wherein said two layers of film include a first layer of polysilicon and a second layer of rugged polysilicon.

12. A combination, comprising:

a transistor fabricated on a substrate, said transistor having a control terminal structure extending above the substrate and source and drain regions formed by active regions in the substrate on opposite sides of said control terminal structure; and a capacitor fabricated above said control terminal structure and one of said active regions, said capacitor formed of a lower cell plate having first and second aligned layers of film, said first layer being lightly doped and said second layer positioned on top of said first layer and being heavily doped, said second layer having a dopant density which decreases from said portion overlying said control terminal structure to the portion overlaying the active region, a layer of dielectric material positioned on top of said layers of film, and an upper cell plate on top of said layer of dielectric material.

13. The combination of claim 12 wherein said active regions include a halo region and an n-type implant region.

14. The combination of claim 12 wherein said control terminal structure includes, in a stack, a layer of gate oxide, a conductively doped polysilicon region, a metal silicide layer and an oxide cap, said control terminal structure further comprising an oxide spacer positioned between said stack and said capacitor.

15. The combination of claim 12 wherein said first and second aligned layers of film include a first layer of polysilicon approximately 600–1200 Angstroms thick and a second layer of polysilicon approximately 600 Angstroms thick, respectively.

16. The combination of claim 12 wherein said first and second aligned layers include a first layer of polysilicon and a second layer of rugged polysilicon, respectively.

* * * * *